(12) United States Patent
Park

(10) Patent No.: US 6,303,481 B2
(45) Date of Patent: Oct. 16, 2001

(54) METHOD FOR FORMING A GATE INSULATING FILM FOR SEMICONDUCTOR DEVICES

(75) Inventor: Dong Su Park, Kyoungki-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/750,226

(22) Filed: Dec. 29, 2000

(30) Foreign Application Priority Data

Dec. 29, 1999 (KR) .................................. 99-64610

(51) Int. Cl.$^7$ ............................... H01L 21/3205
(52) U.S. Cl. ................. 438/591; 438/216; 438/261; 438/287; 438/585; 438/785
(58) Field of Search ..................... 438/151, 216, 438/261, 263, 287, 299, 585, 591, 781, 785

(56) References Cited

U.S. PATENT DOCUMENTS 4,446,474 * 5/1984 Mizusaki et al. ..................... 357/25
6,156,600 * 12/2000 Chao et al. ........................... 438/238
6,171,900 * 1/2001 Sun ...................................... 438/240

FOREIGN PATENT DOCUMENTS

5342635 * 12/1993 (JP) .

* cited by examiner

Primary Examiner—Charles Bowers
Assistant Examiner—Jack Chen
(74) Attorney, Agent, or Firm—Pillsbury Winthrop LLP

(57) ABSTRACT

A method for forming a gate insulating film for a semiconductor device comprising forming an insulating film of silicon nitride or silicon oxynitride in the active regions of the semiconductor substrate; forming an amorphous TaON insulating film on the insulating film; and crystallizing the amorphous TaON insulating film. Using TaON as the primary gate insulating film provides a high dielectric constant ($\in=20\sim25$), and thus produces a gate insulating film having properties superior to those possible with silicon dioxide gate films and thus more suitable for use in highly integrated semiconductor devices.

24 Claims, 2 Drawing Sheets

METHOD FOR FORMING A GATE INSULATING FILM FOR SEMICONDUCTOR DEVICES

BACKGROUND OF THE INVENTION

1. Field of the Invention

The present invention relates to a method for forming a gate insulating film for a semiconductor device, and in particular to an improved method for forming a gate insulating film for a high integration semiconductor device which has a superior electric property.

2. Description of the Background Art

In general, in a metal oxide semiconductor field effect transistor (MOSFET), the gate electrodes are isolated from the substrate by a thin, high quality, silicon dioxide film that is referred to as the gate oxide or gate insulating film. By insulating the gate electrodes from the substrate, MOSFET devices provide reduced impedance when compared with equivalent junction effect transistors (JFET). In addition, the silicon dioxide gate insulating film is easily formed by a single and relatively brief thermal oxidation process, making the process generally suitable for even highly integrated semiconductor devices.

However, as the level of integration of semiconductor memory devices has increased, the size of the various components that define a functional unit cell have become even more miniaturized. For a DRAM cell transistor, this has required reductions in both the thickness of the gate insulating film and the gate width. For example, advanced memory devices such as a 256M DRAM generally use a conventional gate insulating film of approximately 50 Å of silicon dioxide that is formed in a wet oxidation process at between 800 and 900° C. to obtain the necessary device properties. The minimum thickness of the silicon dioxide gate insulating film is, however, limited by the need to maintain adequate breakdown resistance and other parametric properties.

Recently, a $Ta_2O_5$ film having a higher dielectric constant ($\in$ of approximately 25) has been used as the gate insulating film for highly integrated memory devices as an alternative to the conventional $SiO_2$ film. However, because the deposited $Ta_2O_5$ film has an relatively unstable stoichiometry, vacancy Ta atoms resulting from variations in the composition ratio between the component Ta and O atoms will be present in the thin film. Further, during the deposition of the $Ta_2O_5$ gate insulating film various contaminants such as carbon (C), carbon compounds ($CH_4$, $C_2H_4$, etc.) and water vapor ($H_2O$) may be generated and incorporated into the film. This contaminants are the result of by-product reactions between the organic metal precursor, such as $Ta(OC_2H_5)_5$ or $Ta(N(CH_3)_2)_5$, and the reaction gas, typically $O_2$ or $N_2O$, in the deposition chamber.

These contaminants, as well as other ions or radicals present in the film, will result in increased leakage currents and degraded dielectric properties if left untreated. In order to overcome such a disadvantage, the deposited $Ta_2O_5$ film is typically subjected to at least one low temperature thermal treatment (for example, a plasma $N_2O$ or $UV-O_3$ treatment) and at least one high temperature thermal treatment. These thermal treatments are, however, rather complicated and can produce in other undesirable results. For example, because the $Ta_2O_5$ can act as a strong oxidizer, it can react with the silicon substrate during the high temperature thermal treatment and form a heterogeneous parasitic oxide film at the interface. This parasitic oxide film degrades the electrical properties of the $Ta_2O_5$ gate insulating film and increases the thickness of the gate insulating film.

SUMMARY OF THE INVENTION

Accordingly, a primary object of the present invention is to provide a method for forming a gate insulating film for a semiconductor device that exhibits superior electric properties.

Another object of the present invention is to provide a method for forming a gate insulating film for a semiconductor device that prevents degradation or deterioration of the electric properties of the resulting semiconductor device.

Still another object of the present invention is to provide a method for forming a gate insulating film for a semiconductor device that simplifies the fabrication process.

Still another object of the present invention is to provide a method for forming a gate insulating film for a semiconductor device that can increase the life span of the resulting products.

In order to achieve these objects, the present invention provides a method for forming a gate insulating film for a semiconductor device including the steps of: providing a semiconductor substrate where a field oxide film for defining an active region and a device isolating region has been formed; forming an insulating film containing nitride on the exposed surface of the semiconductor substrate; forming an amorphous TaON insulating film on the insulating film; and crystallizing the amorphous TaON insulating film.

In addition, the present invention provides a method for forming a gate insulating film for a semiconductor device, including the steps of: providing a semiconductor substrate where a field oxide film for defining an active region and a device isolating region has been formed; forming an SiN or SiON-film on the exposed surface of the semiconductor substrate; forming an amorphous TaON insulating film on the SiN or SiON film; and crystallizing the amorphous TaON insulating film.

The present invention also provides a method for forming a gate insulating film for a semiconductor device, including the steps of: providing a semiconductor substrate where a field oxide film for defining an active region and a device isolating region has been formed; forming an insulating film containing nitride on the exposed surface of the semiconductor substrate; forming an amorphous TaON insulating film on the insulating film; and crystallizing the amorphous TaON insulating film according to an annealing process.

The above objects, and other features and advantages of the present invention will become more apparent in light of the following detailed description and the accompanying figures.

DETAILED DESCRIPTION OF THE PREFERRED EMBODIMENTS

Figure 1:
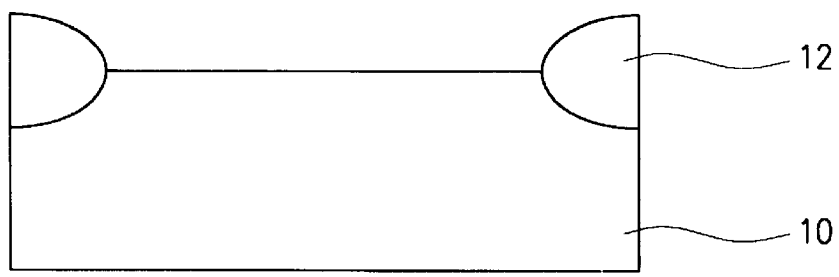
FIGS. 1 to 5 are cross-sectional views illustrating sequential steps of a method for forming a gate insulating film for a semiconductor device in accordance with the present invention.
Figure 2:
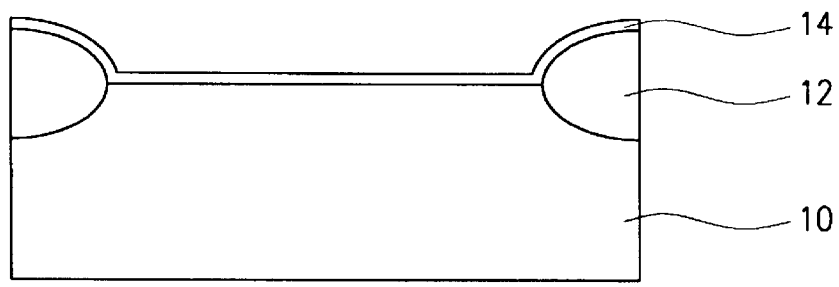

Referring to FIG. 1, a field oxide film 12 is formed on a semiconductor substrate 10 to define an active region and a device isolating region according to a conventional device isolation process such as LOCOS or trench processes. As illustrated in FIG. 2, the surface of the substrate 10 in the action region is then cleaned, typically using chemicals such as HF, SC-1 ($NH_4OH$ mixture in which $NH_4OH+H_2O_2+H_2O$ is mixtured to a rate of 1:4:20) and/or $H_2SO_4$ to remove any natural oxide film, particles, or other contaminants.

After the surface of the substrate has been cleaned, a silicon nitride ($Si_xN_y$; Si—N bond) or silicon oxynitride (SiON) film 14 is formed on the surface of the substrate. This film 14 prevents the formation of a heterogeneous oxide film having a low dielectric constant at the interface between the substrate 10 and the gate insulating film during subsequent processing such as the deposition of an amorphous TaON film. A suitable $Si_xN_y$(Si—N bond) film may be formed in a low pressure chemical vapor deposition (LPCVD) chamber operating at 200 to 600° C. by forming a plasma and supplying ammonia ($NH_3$) or forming gas ($N_2/H_2$). Alternatively, a SiON film may be formed in the low pressure chemical vapor deposition chamber at 200 to 600° C., by forming a plasma and supplying a mixture of ammonia ($NH_3$) and oxygen ($O_2$) (for example, a ratio of $NH_3$: $O_2$ is 0.5:1 to 10:1, or preferably 3:1 to 5:1) and/or $N_2O$ gas through a mass flow controller at 10 to 1000 sccm.

A process of forming SiON film is carried out under a power of 50 to 600 W and a pressure of 0.2 to 10 torr.

Preferably, in the formation of a SiON film, $NH_3$ is injected into the deposition chamber for an initial period before beginning the injection of the $O_2$ and/or $N_2O$ to further suppress formation of a parasitic oxide film on the surface of the substrate 10.

Thus, in contrast to the conventional method, the surface of substrate 10 is nitrided (or oxynitrided) at a low temperature of 200 to 600° C. before depositing the amorphous TaON film. This nitriding (or oxynitriding) process helps maintain the electric properties the subsequent thin films and resulting device.

Figure 3:
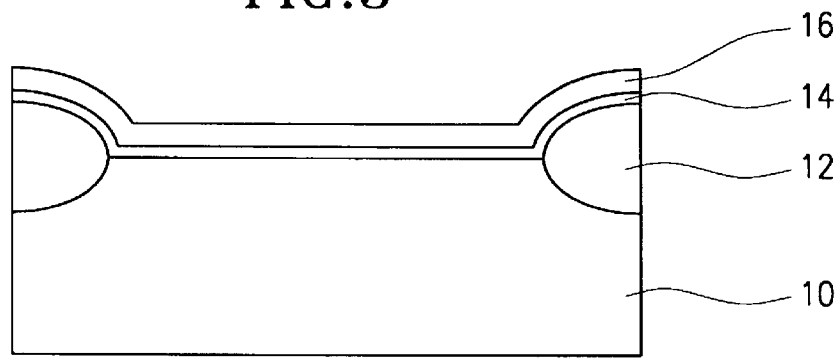

As depicted in FIG. 3, an amorphous TaON film 16 is then deposited on the SiN or SiON film 14 using a LPCVD process. A gate insulating film is actually the stacked structure of the SiN or SiON film 14 and amorphous TaON film 16.

The TaON film 16 is the product of the reaction between a tantalum-containing organic metal compound, such as $Ta(OC_2H_5)_5$ or $Ta(N(CH_3)_2)_5$, with reaction gases $NH_3$ and $O_2$ at a temperature of 300 to 600° C. The absolute and relative flow rates of the Ta chemical vapor, $NH_3$ and $O_2$ gases into the LPCVD chamber are controlled to produce the desired TaON film. The process of forming TaON 16 is carried out under Ta source of 3 to 100 mg/min, $NH_3$)of 10 to 1000 sccm and $O_2$ of 0.1 to 10000 sccm.

The Ta chemical vapor is typically prepared by injecting a predetermined amount of the Ta compound, either directly or in solution, into an evaporator through a mass flow controller (MFC), and evaporating it at a temperature ranging from 150 to 200° C., a power ranging from 10 to 50 W and a pressure of from 0.15 to 2 torr (in a low pressure process) or from 50 to 300 torr (in a high pressure process).

In order to increase the density of the gate insulating film 16 and reduce the level of impurities, the deposited TaON film is annealed. This annealing process removes the carbon, carbon compounds, water, and oxygen vacancies present in the thin film and induces crystallization of the amorphous TaON film.

This annealing process preferably utilizes either a rapid thermal process or an electric furnace to treat the wafer under an atmosphere of $N_2O$, $O_2$ or $N_2$ for a period of between 0.5 to 30 minutes and at a temperature ranging from 650 to 950° C. This annealing process converts and/or removes the carbon-based contaminants as volatile carbon compounds (such as CO, $CO_2$, $CH_4$, $C_2H_4$) and induces crystallization of the amorphous TaON film. In addition to crystallizing the TaON film, this annealing process corrects other structural defects such as micro cracks and pinholes in the film, thereby improving the overall film homogeneity to provide an improved gate insulating film 16.

In the alternative, the surface of the TaON gate insulating film 16 may be nitrided with a plasma treatment in an atmosphere of $NH_3$ (or $N_2/H_2$), or oxynitrided in an atmosphere of $N_2O$ (or a mixture of $N_2$ and $O_2$), at a temperature ranging from 200 to 600° C. This nitriding or oxynitriding process may be performed either in-situ after the deposition of the TaON film or in a subsequent ex-situ process. If the TaON film is subjected to either the nitriding or oxynitriding process, the separate high temperature annealing process (650–900° C.) described above may be skipped. The TaON gate insulating film 16 will, however, generally be crystallized during subsequent thermal processing associated with the formation of the gate electrode.

Figure 4:
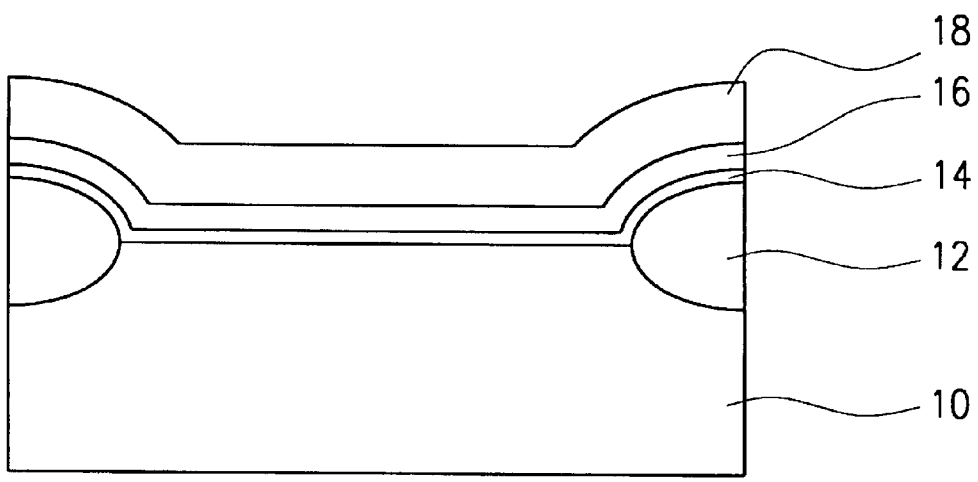

As illustrated in FIG. 4, a doped polysilicon film 18 that will serve as the gate electrode is then formed on the upper portion of the gate insulating film 16. The gate electrode may also include a silicide, such as a W-silicide or a Ti-silicide, that is stacked on the doped polysilicon film 18 to lower the effective gate electrode resistance.

Figure 5:
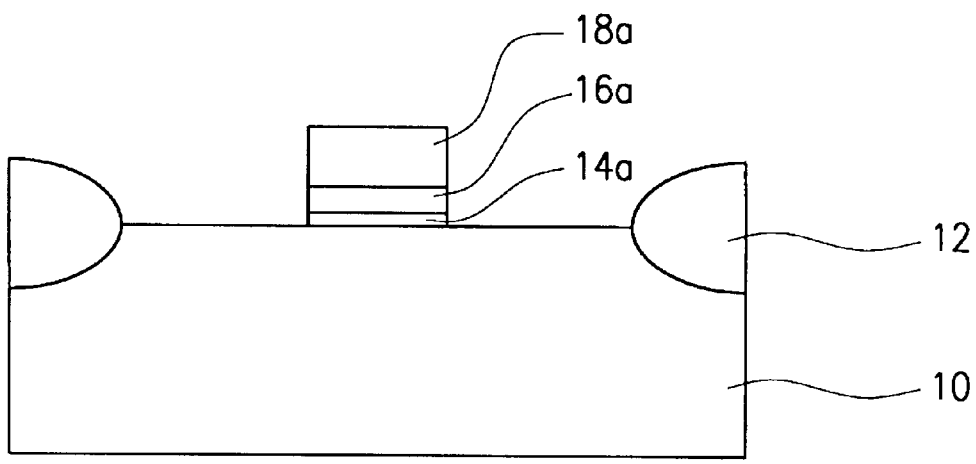

Referring to FIG. 5, the doped polysilicon film 18, with or without an additional silicide layer, the TaON gate insulating film 16 and the SiN or SiON film 14 are then patterned and etched using conventional photolithography and etch processes to form the gate structure. The remaining portions of the doped polysilicon film 18a, the TaON gate insulating film 16a and the SiN or SION film 14a comprise the completed gate structure.

The method for forming the gate insulating film for the semiconductor device in accordance with the present invention provide the following advantages:

Firstly, the dielectric constant ($\in$=20~25) of the TaON film used for the gate insulating film is significantly higher than the conventional $SiO_2$ gate insulating film. This improvement in dielectric constant allows the physical thickness of the gate insulating film to be increased while simultaneously reducing the electrical thickness when compared with a conventional gate oxide film. Thus a gate insulating film according to the present invention increases the resistance of a highly integrated semiconductor device to degraded gate performance or gate failure, thereby improving the life span of resulting products.

In addition, as compared with the conventional $Ta_2O_5$ gate insulating film, the TaON gate insulating film has a more stable structure, and thus exhibits reduced oxidation reactivity with the silicon substrate and gate electrode. The TaON gate insulating film according to the present invention is, therefore, is resistant to externally-applied electric discharges (ESD), provides a high insulation breakdown voltage, and exhibits very low leakage currents.

Moreover, the oxidation resistance of the interface between the silicon substrate 10 and the gate insulating film can be increased by nitriding or oxynitriding the surface of the silicon substrate 10 before depositing the TaON gate insulating film. As a result, generation of a heterogeneous oxide film is further suppressed, thereby providing improved interface properties.

In contrast to conventional nitriding or oxynitriding processes utilizing rapid thermal treatment, the nitriding or oxynitriding processes of the present invention are performed at lower temperatures of between 200 and 600° C., thereby avoiding degradation of other electric properties. Furthermore, the nitriding or oxynitriding processes of the present invention can be performed in-situ in combination with the TaON deposition, thus eliminating the need for special or separate apparatus and providing additional simplification of the fabrication process.

As the present invention may be embodied in several forms without departing from the spirit or essential characteristics thereof, it should also be understood that the embodiments is not limited to the specific details provided in the foregoing description, unless otherwise specified, but rather should be construed broadly within its spirit and scope as defined in the appended claims. All changes and modifications to the specifically described methods that fall within the meets and bounds of the claims, or equivalences of such meets and bounds are, therefore, intended to be embraced by the appended claims.

What is claimed is:

1. A method for forming a gate insulating film for a semiconductor device, comprising the steps of:
   providing a semiconductor substrate comprising active regions and isolation regions;
   forming an insulating film containing nitrogen on the exposed surface of the semiconductor substrate;
   forming an amorphous TaON insulating film on an insulating film; and
   crystallizing the amorphous TaON insulating film.

2. The method according to claim 1, wherein the insulating film containing nitrogen comprises a silicon nitride or a silicon oxynitride film.

3. The method according to claim 2, wherein the step of forming the insulating film containing nitrogen further comprises
   forming a silicon nitride film in a LPCVD chamber, the LPCVD chamber being operated at a temperature between 200 and 600° C., by a reaction of the semiconductor substrate and $NH_3$ or a mixture of $N_2$ and $H_2$ or
   forming a silicon oxynitride film in a LPCVD chamber, the LPCVD chamber being operated at a temperature between 200 and 600° C., by a reaction of the semiconductor substrate and $NH_3$ and $O_2$ or $N_2O$.

4. The method according to claim 3, wherein the step of forming the silicon oxynitride film further comprises the steps of
   introducing $NH_3$ into the LPCVD chamber for a first period of time and
   subsequently introducing a mixture of $NH_3$ and $O_2$ or $N_2O$ into the LPCVD chamber for a second period of time.

5. The method according to claim 1, wherein the step of forming an amorphous TaON insulating film further comprises
   supplying an amount of a Ta compound to an evaporator through a flow controller,
   evaporating the Ta compound at a temperature ranging from 150 to 200° C. to form a Ta chemical vapor, and
   injecting the Ta chemical vapor into a LPCVD chamber.

6. The method according to claim 1, wherein the step of forming an amorphous TaON insulating film further comprises
   supplying amounts of a Ta chemical vapor, $O_3$ and/or $O_2$ and $NH_3$ to a LPCVD chamber,
   operating the LPCVD chamber at a temperature between 300 and 600° C., at a pressure of less than 100 Torr, and with a power of from 0.15 to 2 torr (in a low pressure process) or 50 to 300 torr (in a high pressure process) applied to induce a surface chemical reaction between the Ta chemical vapor, $O_3$ and $NH_3$.

7. The method according to claim 1, wherein the step of crystallizing the amorphous TaON insulating film further comprises annealing the amorphous TaON insulating film.

8. The method according to claim 7, wherein the step of annealing the amorphous TaON insulating film further comprises
   heating the amorphous TaON insulating film to a temperature within a temperature range between 650 and 950° C. and
   maintaining the amorphous TaON insulating film within this temperature range for a period of time between 0.5 and 30 minutes.

9. The method according to claim 7, wherein the step of annealing the amorphous TaON insulating film further comprises
   heating the amorphous TaON insulating film under an atmosphere of $N_2O$, $O_2$ or $N_2$ to a temperature within a temperature range between 650 to 950° C.
   maintaining the amorphous TaON insulating film within this temperature range for a period of time between 1 to 30 minutes.

10. The method according to claim 1, further comprising
    nitriding or oxynitriding a surface of the amorphous TaON insulating film with a plasma treatment under an atmosphere of $NH_3$ or $N_2$ and $H_2$ at a temperature ranging from 200 to 600° C.

11. The method according to claim 10, wherein the step of nitriding or oxynitriding the surface of the amorphous TaON insulating film replaces the step of crystallizing the amorphous TaON insulating film.

12. A method for forming a gate insulating film for a semiconductor device, comprising the steps of:
    providing a semiconductor substrate comprising active regions and device isolation regions, a surface of the semiconductor substrate being exposed in the active regions;
    forming an insulating film on the active regions of the semiconductor substrate, wherein the insulating film comprises silicon nitride or silicon oxynitride;
    forming an amorphous TaON insulating film on the silicon nitride or silicon oxynitride; and
    crystallizing the amorphous TaON insulating film.

13. The method according to claim 12, wherein the step of forming the insulating film further comprises forming a silicon nitride film in a LPCVD chamber, the LPCVD chamber being operated at a temperature of between 200 and 600° C., under an atmosphere of $NH_3$ or $N_2$ and $H_2$.

14. The method according to claim 12, wherein the step of forming the insulating film further comprises forming a silicon oxynitride film in a LPCVD chamber, the LPCVD chamber being operated at a temperature between 200 and 600° C., under an atmosphere of $NH_3$ and $O_2$ or $N_2O$.

15. The method according to claim 12, wherein the step of forming an amorphous TaON insulating film further comprises
    obtaining a Ta chemical vapor by supplying a fixed amount of a Ta compound an evaporator through a mass flow controller, and
    evaporating the Ta compound at a temperature ranging from 150 to 200° C.

16. The method according to claim 12, wherein the step of forming the amorphous TaON insulating film further comprises
    supplying amounts of a Ta chemical vapor, $O_3$ and/or $O_2$ and $NH_3$ to a LPCVD chamber, operating the LPCVD chamber at a temperature between 300 and 600° C., at a pressure of less than 100 Torr, and with a power of from 0.15 to 2 torr (in a low pressure process) or 50 to 300 torr (in a high pressure process) applied to induce a surface chemical reaction between the Ta chemical vapor, $O_3$ and $NH_3$.

17. The method according to claim 12, wherein the step of crystallizing the amorphous TaON insulating film further comprises annealing the amorphous TaON insulating film.

18. The method according to claim 17, wherein the step of annealing the amorphous TaON insulating film further comprises heating the amorphous TaON insulating film to a temperature within a temperature range between 650 and 950° C. and maintaining the amorphous TaON insulating film within this temperature range for a period of time between 0.5 and 30 minutes.

19. The method according to claim 17, wherein the step of annealing the amorphous TaON insulating film further comprises heating the amorphous TaON insulating film under an atmosphere of $N_2O$, $O_2$ or $N_2$ to a temperature within a temperature range between 650 to 950° C.

maintaining the amorphous TaON insulating film within this temperature range for a period of time between 1 to 30 minutes.

20. The method according to claim 12, further comprising nitriding a surface of the amorphous TaON insulating film with a plasma treatment under an atmosphere of $NH_3$ or $N_2$ and $H_2$ at a temperature ranging from 200 to 600° C.

21. A method for forming a gate insulating film for a semiconductor device, comprising the steps of:

providing a semiconductor substrate, the semiconductor substrate comprising active regions separated by device isolating regions, the device isolating regions comprising field oxide;

forming an insulating film containing nitrogen on the active regions of the semiconductor substrate;

forming an amorphous TaON insulating film on the insulating film; and crystallizing the amorphous TaON insulating film.

22. The method according to claim 21, wherein the step of crystallizing the amorphous TaON insulating film further comprises annealing the amorphous TaON insulating film with a rapid thermal treatment at a temperature ranging from 650 to 950° C., the duration of the rapid thermal treatment being between 0.5 minute and 30 minutes.

23. The method according to claim 21, wherein the step of crystallizing the amorphous TaON insulating film further comprises annealing the amorphous TaON insulating film in an electric furnace for between 1 and 30 minutes under an atmosphere of $N_2O$, $O_2$ or $N_2$ at a temperature ranging from 650 to 950° C.

24. The method according to claim 21, further comprising a step for nitriding a surface of the amorphous TaON insulating film in an atmosphere of $NH_3$ or $N_2/H_2$ at a temperature ranging from 200 to 600° C.

* * * * *